United States Patent
Choi et al.

(10) Patent No.: US 7,372,738 B2
(45) Date of Patent: May 13, 2008

(54) FLASH MEMORY DEVICE WITH REDUCED ERASE TIME

(75) Inventors: Jong-In Choi, Seongnam-si (KR); Ji-Ho Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 205 days.

(21) Appl. No.: 11/405,577

(22) Filed: Apr. 18, 2006

(65) Prior Publication Data
US 2007/0047353 A1    Mar. 1, 2007

(30) Foreign Application Priority Data
Aug. 30, 2005   (KR) .................. 10-2005-0080164

(51) Int. Cl.
*G11C 11/34* (2006.01)
(52) U.S. Cl. .............................. 365/185.25; 365/185.29
(58) Field of Classification Search .......... 365/185.29, 365/204, 185.25, 185.3, 185.23
See application file for complete search history.

(56) References Cited

U.S. PATENT DOCUMENTS

| 6,456,534 B2 | 9/2002 | Jinbo |
| 6,643,183 B2 | 11/2003 | Atsumi et al. |
| 2005/0007832 A1 | 1/2005 | Macerola |

FOREIGN PATENT DOCUMENTS

| JP | 2000021186 | 1/2000 |
| JP | 2000-298991 | 10/2000 |
| JP | 2001-351390 | 12/2001 |
| JP | 2002-367388 | 12/2002 |
| KR | 100223263 B1 | 7/1999 |
| KR | 19990080811 | 11/1999 |
| KR | 1020010069183 | 7/2001 |
| KR | 1020010111050 | 12/2001 |
| KR | 1020040008526 A | 1/2004 |
| WO | 03025937 A2 | 3/2003 |

*Primary Examiner*—Son Dinh
*Assistant Examiner*—Hien N Nguyen
(74) *Attorney, Agent, or Firm*—Volentine & Whitt, PLLC

(57) ABSTRACT

A NOR flash memory device comprises a memory cell array, a row selection circuit adapted to drive wordlines in the memory cell array with a wordline voltage during an erase operation, and an erase voltage generating circuit adapted to generate an erase voltage as the wordline voltage during the erase operation. The erase voltage generating circuit includes a discharging circuit receiving a high voltage that is regularly maintained irrespective of variations in a power voltage, and discharging the erase voltage supplied from the wordline during an erasing recovery period of the erase operation.

8 Claims, 4 Drawing Sheets

FLASH MEMORY DEVICE WITH REDUCED ERASE TIME

BACKGROUND OF THE INVENTION

1. Field of the Invention

Embodiments of the present invention are related to semiconductor memory devices. In particular, embodiments of the invention are related to flash memory devices.

This application claims priority to Korean Patent Application No. 2005-80164, filed Aug. 30, 2005, the subject matter of which is hereby incorporated by reference in its entirety.

2. Description of Related Art

Flash memory is one type of non-volatile memory. It is commonly used as a replacement for conventional electrically erasable programmable read only memory (EEPROM) which is generally formed by plural memory sectors, each being erasable and/or programmable using a single programming operation. Thus, while conventional EEPROM devices are well adapted to slow speed applications which do not suffer from the fact that erase and programming operations must be carried on a memory block by memory block basis, flash memory devices are efficiently adapted to higher speed applications (e.g., applications running at higher clock frequencies), since a system employing flash memory may read and write data to separate memory blocks at the same time.

However, both flash memory devices and EPROM devices have a limited lifetime due to the presences of certain insulation films that break down with use over time. These insulation films are generally associated with storage elements and are gradually destroyed by the hundreds and thousands of erase and programming operations performed on the respective memory devices.

Like all non-volatile memory devices, flash memory devices store information even when power is not applied to the device. Thus, information stored in the device is retained during power interruptions. Flash memory devices are also very resistant to physical shocks and provide a fast access time during read operations. Owing to such merits, flash memory devices are commonly employed within the memory system of host devices powered by a battery.

Flash memory devices may be classified into NOR and NAND type devices, in accordance with the primary type of logic gate used in their architecture. The memory cells of a flash memory device are formed in an array, and each cell in the array is typically adapted to store a single bit of information. However, multi-level cells are designed to store more than one bit of information by varying the amount of electrical charge accumulated on a constituent floating gate.

In a NOR flash memory device, each memory cell is very similar in structure to that of a typical MOSFET transistor, except that it has two gates. One gate is called the control gate (CG) and it generally operates like the gate of an MOS transistor. The other gate is called a floating gate (FG) and is electrically isolated by a surrounding insulation film. The floating gate is interposed between the control gate and the substrate (or a bulk material).

Since the floating gate is electrically isolated by the insulation film, electrons near the floating gate tend to accumulate on the floating gate and may be variously used to store information. Electrons accumulating on the floating gate influence an electric field associated with the control gate (e.g., partially offsetting the electric field) and thereby change the threshold voltage of the memory cell. Thus, in response to a specific voltage applied to the control gate during a read operation, current may or may not flow through the memory cell in accordance with its threshold voltage. Such current flow is regulated by the amount of charge accumulated on the floating gate. A data value of "1" or "0" is detected in accordance with whether or not current flows, where the current flow corresponds to data stored in the memory cell. However, in the multi-level cell storing more than one bit per cell, an accumulation of electrons on a floating gate may be detected in accordance with a corresponding amount of current flowing through the memory cell, rather than the mere presence or absence of current.

A NOR flash memory cell is typically programmed (i.e., a data value is stored) by applying a program voltage to the control gate, applying a high voltage (e.g., about 5 to 6V) to the drain. Under this bias condition, a relatively large current flows from drain to source. This type of programming scheme is referred to as "hot electron injection." During an erase operation for the NOR flash memory cell, a high voltage gap is established between the control gate and substrate (or bulk material), which induces a so-called Fowler-Nordheim tunneling effect to release the electrons accumulated on the floating gate.

A cell array of NOR flash memory devices is usually divided into blocks or sectors that are erased as a unit. Memory cells belonging to a particular block are erased at the same time during a single erase operation. Otherwise, a programming operation for the NOR flash memory device may be carried out on a byte or word basis.

Erase operations for a NOR flash memory device may include a pre-program operation, a main erase operation, and a post-program operation. The pre-program operation is performed using bias conditions similar to those of the programming operation. These conditions prevent memory cells from being over-erased into depletion during a subsequent main erase operation. All memory cells in a sector to be erased may be pre-programmed. Next, a main erase operation may be performed such that all memory cells in the sector are placed in an "ON" state. Finally, a post-program operation may be performed to correct any over-erased memory cells. Except for its particular bias conditions, a post-program operation may be performed in a manner similar to that of a pre-program operation.

As noted above, since the erase operations applied to a NOR flash memory device generally include several different operations, the speed of the erase operation is slower than a read operation. This reality is further complicated by the fact that as the operational voltage of the memory device is reduced, the gate voltage for the MOS transistor is also reduced, and the current capacity of the MOS transistor drops. As current capacity drops, it takes longer and longer to charge and discharge the various voltages used during an erase operation. This means that the speed of the erase operation for a NOR flash memory device is effectively decreased as its operating voltage is decreased.

SUMMARY OF THE INVENTION

Among other things, flash memory devices according to embodiments of the invention are capable of reducing an erase time.

In one embodiment, the invention provides a NOR flash memory device comprising; a memory cell array having memory cells coupled to wordlines and bitlines, a row selection circuit adapted to supply a wordline voltage during an erase operation to respective wordlines, an erase voltage generating circuit comprising a discharging circuit receiving a high voltage constantly maintained irrespective of variations in a power voltage and adapted to generate an erase voltage as the wordline voltage during the erase operation to discharge the erase voltage supplied to the respective wordlines during an erasing recovery period of the erase operation.

Pursuant to some embodiments, the discharging circuit comprises: a first voltage divider dividing the high voltage to output a first divide voltage; a first transistor activated by a control signal indicating the erasing recovery period and outputting the first divide voltage; a second voltage divider connected between the first transistor and an output of the erase voltage generating circuit, and dividing the first divide voltage to output a second divide voltage; and a second transistor connected between the output of the erase voltage generating circuit and a ground voltage, and controlled by the second divide voltage.

Pursuant to another embodiment, the first transistor is a PMOS transistor, and the second transistor is an NMOS transistor.

In another embodiment, the invention provides an erase voltage generating circuit of a NOR flash memory device comprising; a pump adapted to generate an erase voltage in response to a clock signal, an oscillator adapted to generate an oscillation signal, a regulator adapted to output the oscillation signal as the clock signal according to whether the erase voltage reaches a target voltage during an erase execution period, a first voltage divider adapted to divide a high voltage and output a first divide voltage irrespective variations in a power voltage, a first transistor adapted to output the first divide voltage in response to a control signal indicating an erase recovery period, a second voltage divider connected between the first transistor and an output of the pump, and adapted to divide the first divide voltage to output a second divide voltage, and a second transistor between the output of the pump and ground and controlled by the second divide voltage.

Pursuant to some embodiments, the high voltage includes a read voltage higher than the power voltage and supplied to a wordline during a read operation, a bitline voltage higher than the power voltage and supplied to a bitline during a program operation, or a bulk voltage higher than the power voltage and supplied to a bulk.

Pursuant to still another embodiment, the regulator is inactivated during the erase recovery period.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

BRIEF DESCRIPTION OF THE DRAWINGS

Exemplary embodiments of the invention will be described in detail with reference to the attached drawings in which like reference symbols indicate the same or similar components. In the drawings.

DESCRIPTION OF EXEMPLARY EMBODIMENTS

Figure 1:
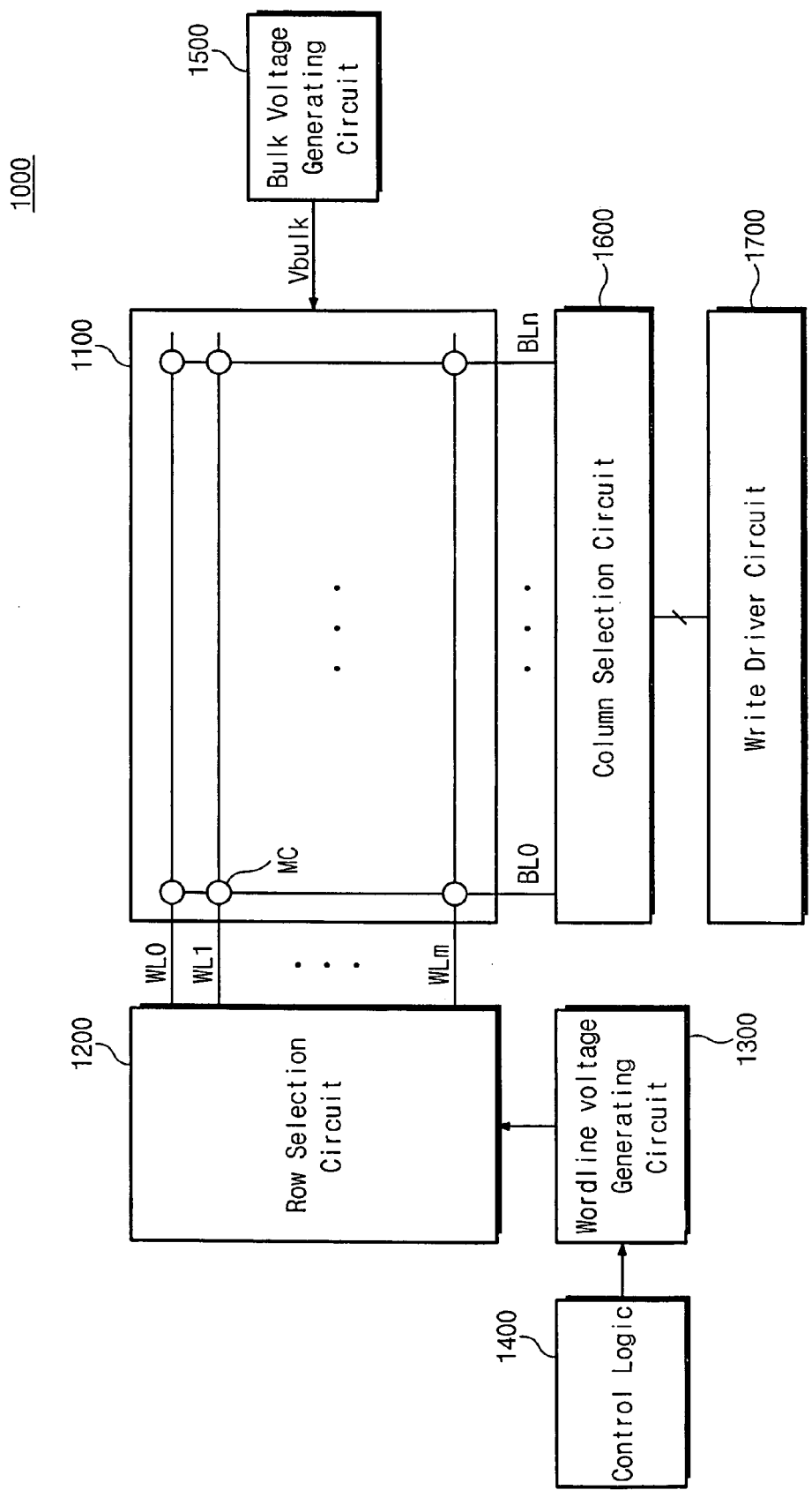
FIG. 1 is a block diagram showing a flash memory device in accordance with an exemplary embodiment of the present invention.

FIG. 1 is a block diagram showing an exemplary flash memory device in accordance to one embodiment of the invention.

Referring to FIG. 1, a NOR flash memory device 1000 comprises a memory cell array 1100 adapted to store information in the form of data values. Memory cell array 1100 comprises non-volatile memory cells (MC) disposed at the respective intersections of wordlines WL0~WLm (or rows) and bitlines BL0~BLn (or columns). Each memory cell MC may be adapted to store either 1-bit data or 2-bit data. A row selection circuit 1200 drives the wordlines WL0~WLm with an erase voltage provided by a wordline voltage generating circuit 1300 during erase operations. Row selection circuit 1200 selects one wordline during program/read operations and drives the selected wordline with a program/read voltage provided by wordline voltage generating circuit 1300. Wordline voltage generating circuit 1300 is controlled by a control logic 1400 and appropriately constructed (as conventionally understood) to generate program/erase/read voltage(s) during various operating modes. Control logic 1400 is adapted to control the entire operation of NOR flash memory device 1000 in its various operating modes.

Referring still to FIG. 1, a bulk voltage generating circuit 1500 is controlled by control logic 1400 and appropriately constructed to supply a bulk voltage to memory cell array 1100 (or a selected sector of memory cell array 1100). A column selection circuit 1600 selects bitlines BL0~BLn according to a defined unit in accordance with an input address during various operating modes. For instance, during a program/read operation, column selection circuit 1600 selects one or more of bitlines BL0~BLn according to the predetermined unit. A write driver 1700 drives the selected bitlines with a bitline voltage according to program data received from an external source during a program operation.

Figure 2:
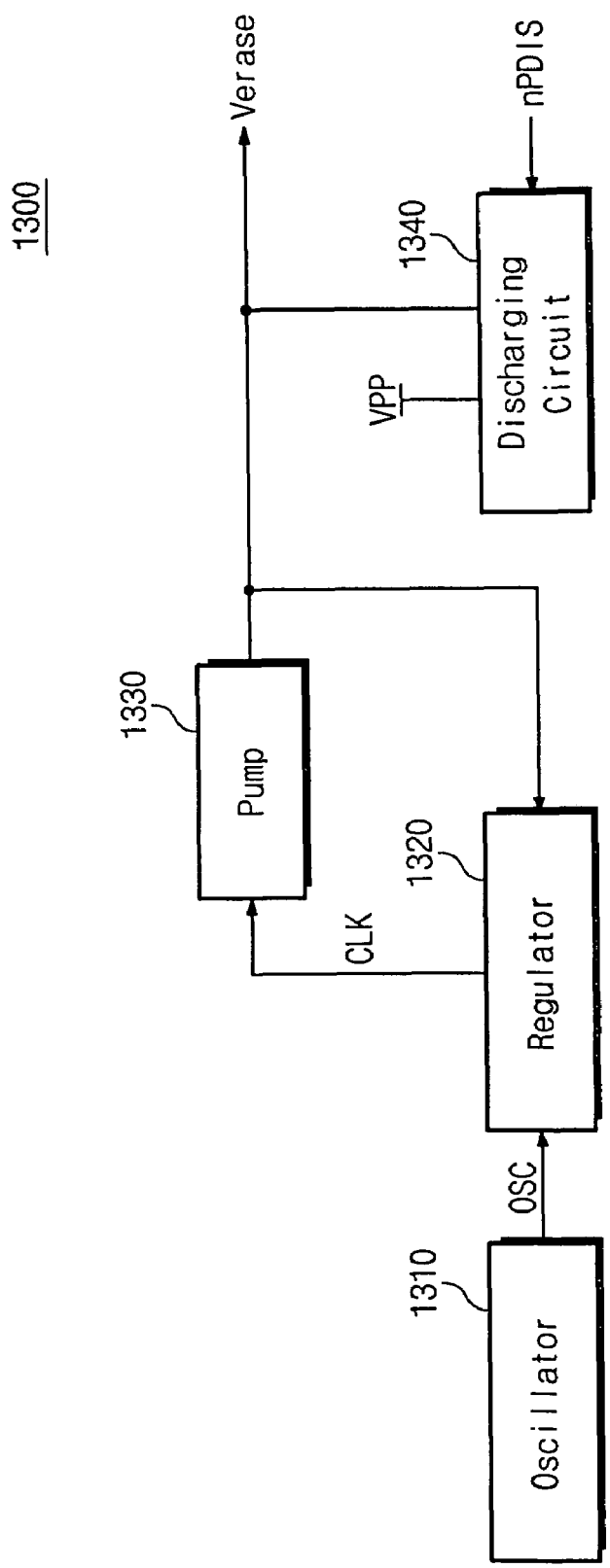
FIG. 2 is a block diagram showing a wordline voltage generating circuit of FIG. 1.

FIG. 2 is a block diagram showing wordline voltage generating circuit 1300 of FIG. 1 in some additional detail. As is well known, an erase operation (e.g., a main erase operation) consists of an erase execution period, an erase recovery period (or discharging period), and an erase verify period. During the erase execution period, an erase voltage is supplied to wordlines. During the erase recovery period, the erase voltage supplied to the wordlines is discharged. During the erase verify period, a determination is made as to whether or not the erased memory cells actually have a required threshold voltage.

Wordlines voltage generating circuit 1300 according to one embodiment of the invention comprises a program voltage generating circuit, a read voltage generating circuit, and an erase voltage generating circuit. In FIG. 2, only erase voltage generating circuit is shown. The other two circuits may be assumed to have a conventional structure for purposes of this discussion.

Referring to FIG. 2, wordline voltage generating circuit 1300 is adapted to generate an erase voltage (Verase), comprises an oscillator 1310, a regulator 1320, a pump 1330, and a discharging circuit 1340. Oscillator 1310 generates an oscillation signal (OSC). Regulator 1320 outputs the oscillation signal OSC as a clock signal (CLK) in accordance with whether an output voltage (e.g., the erase voltage) provided by pump 1330 is higher than a reference voltage during the erase execution period. Pump 1330 performs a pumping operation in response to the clock signal (CLK) and generates the erase voltage (Verase) having a high negative voltage.

During an erase recovery period, regulator 1320 interrupts the oscillation signal (OSC) from being outputted as the clock signal (CLK). This halts the pumping operation of pump 1330. Discharging circuit 1340 receives a high voltage (Vpp) and discharges the erase voltage applied to a wordline in response to a control signal (nPDIS). The control signal (nPDIS) is a signal indicating an erase recovery period to be carried out after an erase execution period, and may be provided by control logic 1400. The high voltage (Vpp) is generated in a flash memory device independent of a variation (e.g., a drop) in the power voltage, and is generally higher than the power voltage. For example, the high voltage (Vpp) may include a read voltage applied to a wordline during a read operation, a bitline voltage applied to a bitline during a program operation, and a bulk voltage applied to the bulk material, etc.

Figure 3:
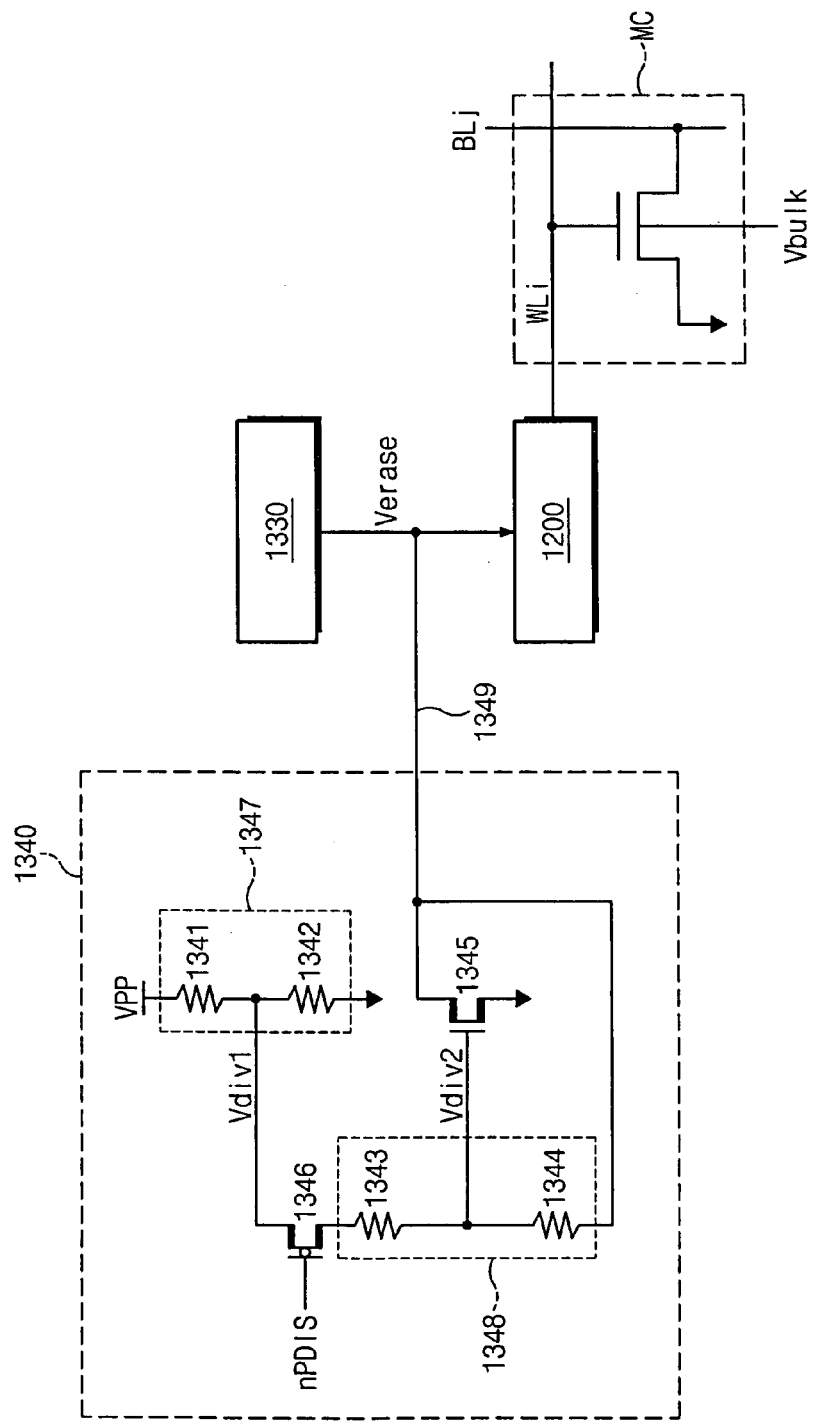
FIG. 3 is a circuit diagram showing a discharging circuit of FIG. 2.

FIG. 3 is a circuit diagram showing an exemplary discharging circuit 1340 in some additional detail. Referring to FIG. 3, the erase voltage (Verase) generated by pump 1330 is applied to a selected wordline (e.g., WLi) by row selection circuit 1200 during the erase execution period. The erase voltage (Verase) applied to the selected wordline (WLi) is discharged to a ground by discharging circuit 1340 during the erase recovery period. In the illustrated embodiment, discharging circuit 1340 comprises a PMOS transistor 1346, an NMOS transistor 1345, a first voltage divider 1347, and a second voltage divider 1348.

First voltage divider 1347 may be formed from a first resistor 1341 and second resistor 1342 serially connected between the high voltage (Vpp) and ground. In addition, first voltage divider 1347 divides the high voltage (Vpp) to output a first divide voltage (Vdiv1). Since the high voltage (Vpp) in any one of its possible forms (e.g., as noted above) is generated by the corresponding pumping circuits, it may be constantly maintained irrespective of any variation in the power voltage. In other words, even if the power voltage drops, the high voltage (Vpp) may be maintained as a constant level.

Referring still to FIG. 3, PMOS transistor 1346 is connected between first voltage divider 1347 and second voltage divider 1348 and controlled by the control signal (nPDIS) activated to a logically low state during the erase recovery period. Second voltage divider 1348 comprises a third resistor 1343 and a fourth resistor 1344 serially connected between PMOS transistor 1346 and an erase voltage line 1349. Second voltage divider 1348 divides an output voltage (Vdiv1) from first voltage divider 1347 provided through PMOS transistor 1346 in order to output a second divide voltage (Vdiv2). NMOS transistor 1345 is connected between erase voltage line 1349 and ground, and is controlled by the output voltage (Vdiv2) of second voltage divider 1348.

Figure 4:
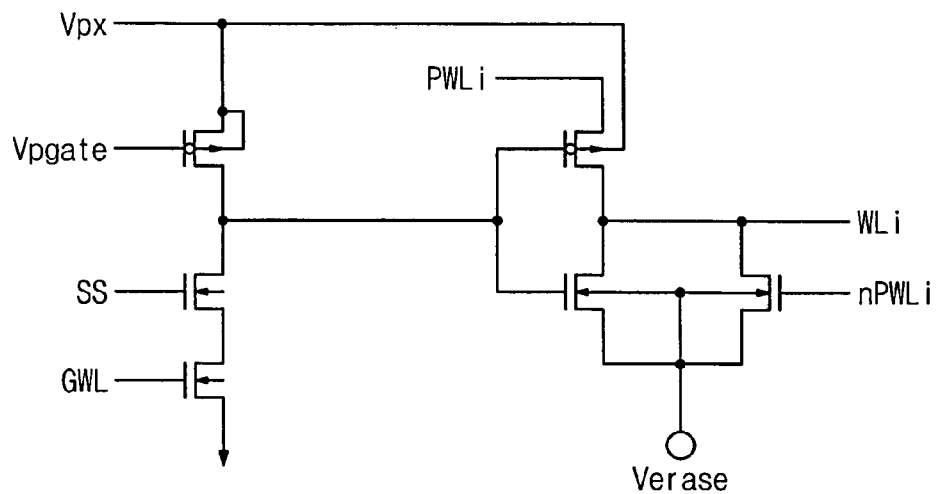
FIG. 4 is a circuit diagram showing a row selection circuit of FIG. 1.

During the erase execution period, the erase voltage (Verase) is supplied to a wordline by NMOS transistor 1345 through row selection circuit 1200. See, FIG. 4, and an NMOS transistor controlled by the control signal (nPWLi). Row selection circuit 1200 is also partially illustrated in the equivalent circuit diagram of FIG. 4. An exemplary row selection circuit 1200, such as the one partially illustrated in FIG. 4, is disclosed in Korean Patent Publication No. 2004-15901, the subject matter of which is hereby incorporated by reference.

In an erase operation, wordline voltage generating circuit 1300 generates an erase voltage (Verase), and bulk voltage generating circuit 1500 generates a bulk voltage (Vbulk). Once the erase voltage (Verase) and the bulk voltage (Vbulk) reach respective corresponding target voltages, the wordlines of memory cell array 1100 are driven with the erase voltage (Verase) by row selection circuit 1200, and with the bulk voltage (Vbulk) by bulk voltage generating circuit 1500, as applied to the bulk material or substrate forming memory cell array 1100.

Under this bias condition, memory cells will be erased. The control signal (nPDIS) is then deactivated (e.g., made logically high in one embodiment) during the erase execution period. The gate of NMOS transistor 1345 in discharging circuit 1340 is connected through resistor 1344 to erase voltage line 1349. This means that NMOS transistor 1345 is turned OFF during the erase execution period. After an erase execution period is performed, the erase voltages applied to the wordlines and the bulk voltage applied to the bulk material are discharged. Namely, an erase recovery operation is performed.

Once an erase sequence enters an erase recovery period, the operation of pump 1320 is stopped by regulator 1320. At the same time, the control signal (nPDIS) is activated to low. As the control signal (nPDIS) is activated, a voltage (Vdiv1) generated by first voltage divide 1347 is applied to second voltage divider 1347 through PMOS transistor 1346. Second voltage divider 1347 divides the supplied voltage (Vdiv1) to output a divide voltage (Vdiv2). For this reason, NMOS transistor 1345 is weakly turned ON. Due to the weakly turned-ON transistor 1345, the erase voltage (Verase) begins to discharge. The lower the erase voltage (Verase) becomes, the higher a gate-source voltage of NMOS transistor 1345 becomes. That is, NMOS transistor 1345 is sufficiently turned ON, such that the erase voltage (Verase) is discharged quickly. At this time, the bulk voltage (Vbulk) will be discharged by bulk voltage generating circuit 1500.

In the event that the gate voltage of NMOS transistor 1345 of discharging circuit 1340 varies in accordance with a fluctuation in the power voltage, the lower the power voltage becomes, the lower the gate voltage the NMOS transistor 1345 becomes. This means that the current capacity of NMOS transistor 1345 drops as the power voltage drops. In other words, as the power voltage drops, the erase recovery time will increase.

Figure 5:
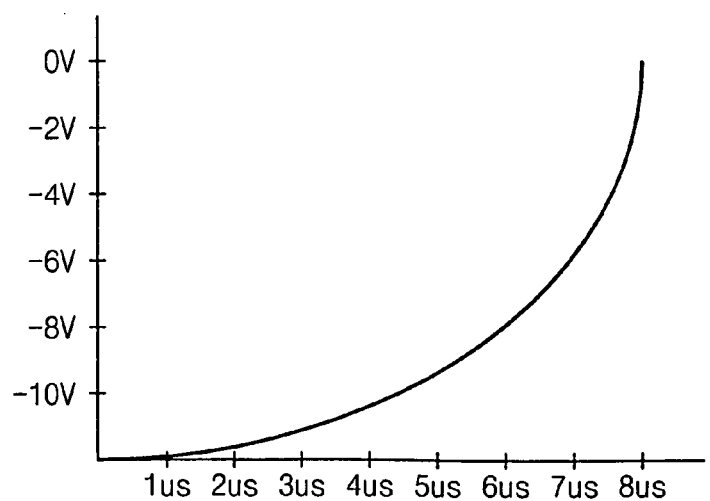
FIG. 5 shows a recovery time of a flash memory device in accordance with an exemplary embodiment of the flash memory device of the present invention.

However, as illustrated by the above description, NMOS transistor 1345 of discharging circuit 1340 is controlled by a voltage that is normally higher than the power voltage and is constantly maintained irrespective of fluctuations in the power voltage. This means that the current capacity (or discharging capacity) of discharging circuit 1340 is constantly maintained irrespective of a drop in the power voltage. In other words, as the power voltage drops, the current capacity (or discharging capacity) of discharging circuit 1340 does not drop. Accordingly, an upward increment in the erase time and the corresponding reduction in erase speed, which are conventionally generated by a drop of the current capacity when the power voltage drops, can be prevented. For example, as shown in FIG. 5, an erase recovery time is shorter than 10 us if an erase voltage is −9V, and a power voltage is 1.4V in an exemplary flash memory device according an embodiment to the invention.

The invention has been described using exemplary embodiments; however, it will be understood that the scope of the invention is not limited to only the disclosed embodiments. Rather, the scope of the invention is intended to encompass various modifications and similar arrangements. The scope of the claims, therefore, should be accorded the broadest interpretation so as to encompass all such modifications and similar arrangements.

What is claimed is:

1. A NOR flash memory device comprising:
   a memory cell array having memory cells coupled to wordlines and bitlines;
   a row selection circuit adapted to supply a wordline voltage during an erase operation to respective wordlines;
   an erase voltage generating circuit comprising a discharging circuit receiving a high voltage constantly maintained irrespective of variations in a power voltage and adapted to generate an erase voltage as the wordline voltage during the erase operation to discharge the erase voltage supplied to the respective wordlines during an erasing recovery period of the erase operation.

2. The NOR flash memory device of claim 1, wherein the discharging circuit comprises:
   a first voltage divider dividing the high voltage to output a first divide voltage;
   a first transistor activated by a control signal indicating the erasing recovery period and adapted to output the first divide voltage;
   a second voltage divider connected between the first transistor and an output of the erase voltage generating circuit, and adapted to divide the first divide voltage to output a second divide voltage; and
   a second transistor controlled by the second divide voltage and connected between the output of the erase voltage generating circuit and ground.

3. The NOR flash memory device of claim 2, wherein the first transistor is a PMOS transistor, and the second transistor is an NMOS transistor.

4. The NOR flash memory device of claim 1, wherein the high voltage comprises a read voltage higher than the power voltage and supplied to a wordline during a read operation, a bitline voltage higher than the power voltage and supplied to a bitline during a program operation, or a bulk voltage higher than the power voltage and supplied to a bulk material or substrate.

5. An erase voltage generating circuit adapted for use in a NOR flash memory device, the erase voltage generating circuit comprising:
   a pump adapted to generate an erase voltage in response to a clock signal;
   an oscillator adapted to generate an oscillation signal;
   a regulator adapted to output the oscillation signal as the clock signal according to whether the erase voltage reaches a target voltage during an erase execution period;
   a first voltage divider adapted to divide a high voltage and output a first divide voltage irrespective variations in a power voltage;
   a first transistor adapted to output the first divide voltage in response to a control signal indicating an erase recovery period;
   a second voltage divider connected between the first transistor and an output of the pump, and adapted to divide the first divide voltage to output a second divide voltage; and
   a second transistor between the output of the pump and ground and controlled by the second divide voltage.

6. The erase voltage generating circuit of claim 5, wherein the high voltage comprises a read voltage higher than the power voltage and supplied to a wordline during a read operation, a bitline voltage higher than the power voltage and supplied to a bitline during a program operation, or a bulk voltage higher than the power voltage and supplied to a bulk material or substrate.

7. The erase voltage generating circuit of claim 5, wherein the first transistor is a PMOS transistor, and the second transistor is an NMOS transistor.

8. The erase voltage generating circuit of claim 5, wherein the regulator is inactivated during the erase recovery period.

* * * * *